US005854604A

United States Patent [19]

Przybysz et al.

[11] Patent Number: 5,854,604

[45] Date of Patent: Dec. 29, 1998

[54] HIGH-POWER WAVEFORM GENERATOR

[75] Inventors: John Xavier Przybysz, Pittsburgh, Pa.; Stephen Pusey Caldwell, Columbia, Md.; Donald Lynn Miller, Export; Andrew Hostetler Miklich, Monroeville, both of Pa.

[73] Assignee: Northrop Grumman Corporation, Los Angeles, Calif.

[21] Appl. No.: 854,856

[22] Filed: May 12, 1997

[51] Int. Cl.$^6$ .......... G01S 7/28

[52] U.S. Cl. .......... 342/175; 342/204

[58] Field of Search .......... 342/82, 175, 195, 342/204, 83; 331/107 S

[56] References Cited

U.S. PATENT DOCUMENTS

| | | | |
|---|---|---|---|
| 3,778,893 | 12/1973 | Thompson | 331/107 S |
| 4,109,247 | 8/1978 | Kaplan | 342/50 |
| 4,344,052 | 8/1982 | Davidson | 333/222 |
| 4,891,649 | 1/1990 | Labaar et al. | 342/175 |
| 5,198,815 | 3/1993 | Przybysz et al. | 341/133 |
| 5,530,927 | 6/1996 | Smith | 455/317 |

OTHER PUBLICATIONS

"The New Superconducting Electronics", ed. by Harold Weinstock and Richard W. Ralston, (ISBN 0–7923–2515–X), *Kluwer Academic Publishers,* 1993.

"Superconducting–Normal–Superconductor Junctions for Digital/Analog Converters", S.P. Benz, National Institute of Standards and Technology, Boulder, CO 80303.

"Josephson Voltage Standard—A Review", Clark A. Hamilton, Charles J. Burroughs and Samuel P. Benz, National Institute of Standards and Technology, Boulder, CO 80303.

*Primary Examiner*—Ian J. Lobo
*Attorney, Agent, or Firm*—Walter G. Sutcliff

[57] ABSTRACT

A method and apparatus for generating a low phase noise RF signal where the output from a low phase-noise stabilized local oscillator operating at relatively high frequencies in the GHz range is combined in a power combiner with a digital data stream generated by a digital waveform generator and which is representative of one or more analog signals in a predetermined frequency spectrum of relatively lower RF frequencies in the MHz range. The combined signal is applied to a Josephson junction array whose output consists of a data stream including pulses of precise constant amplitude and which is then fed to a bandpass filter circuit having a predetermined bandpass. The filter extracts the lower frequency analog signal but now consisting of a signal having low phase-noise. This low phase-noise signal is mixed with the low phase-noise output from the local oscillator, thus providing a low phase- noise RF signal which when coupled to a radar transmitter results in the generation of transmitter radar pulses that enable targets to be detected in "clutter". The power capability of the Josephson junction array can also be increased by adding a source of current to the input to the Josephson junction array. This current is derived from the digital data stream by means of another bandpass filter connected from the digital waveform generator to the power combiner.

25 Claims, 4 Drawing Sheets

FIG. 1
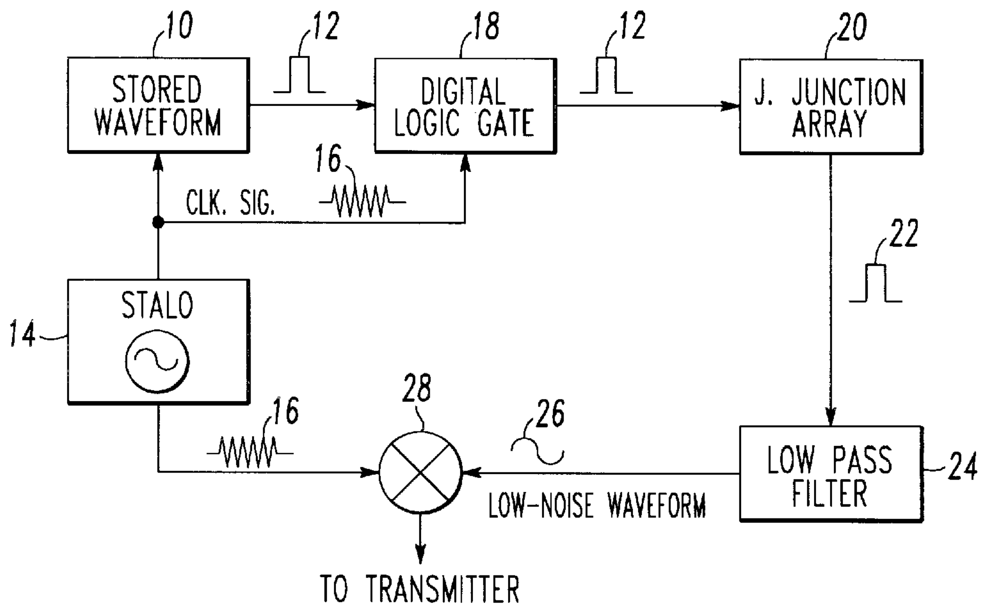
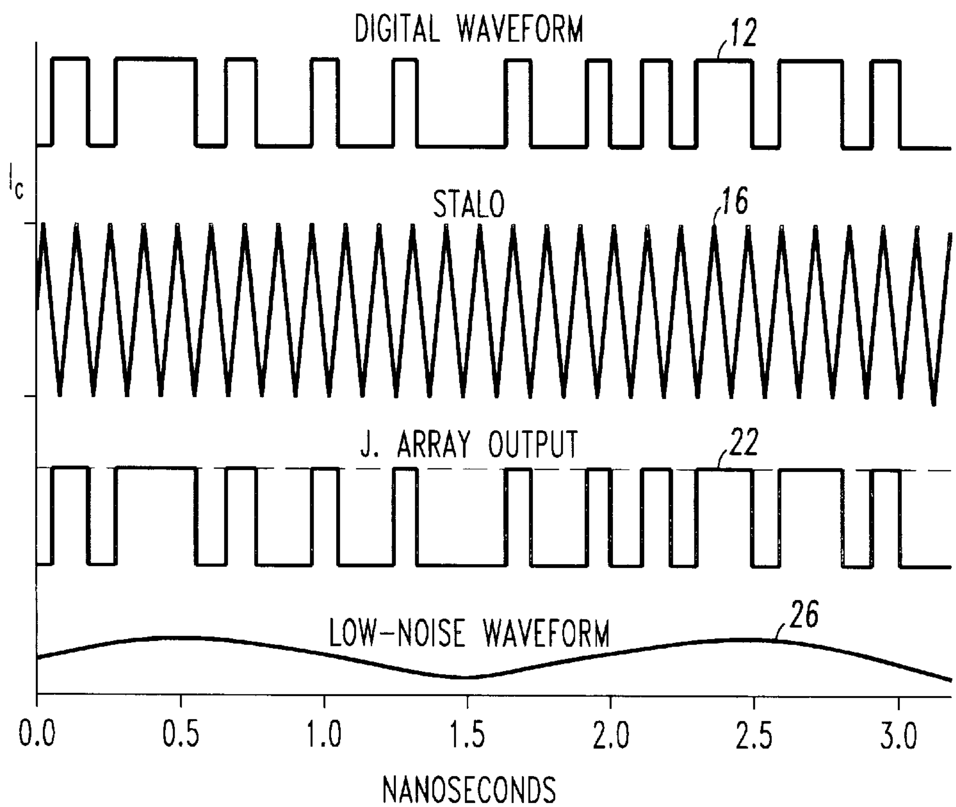
FIG. 2

FIG.3
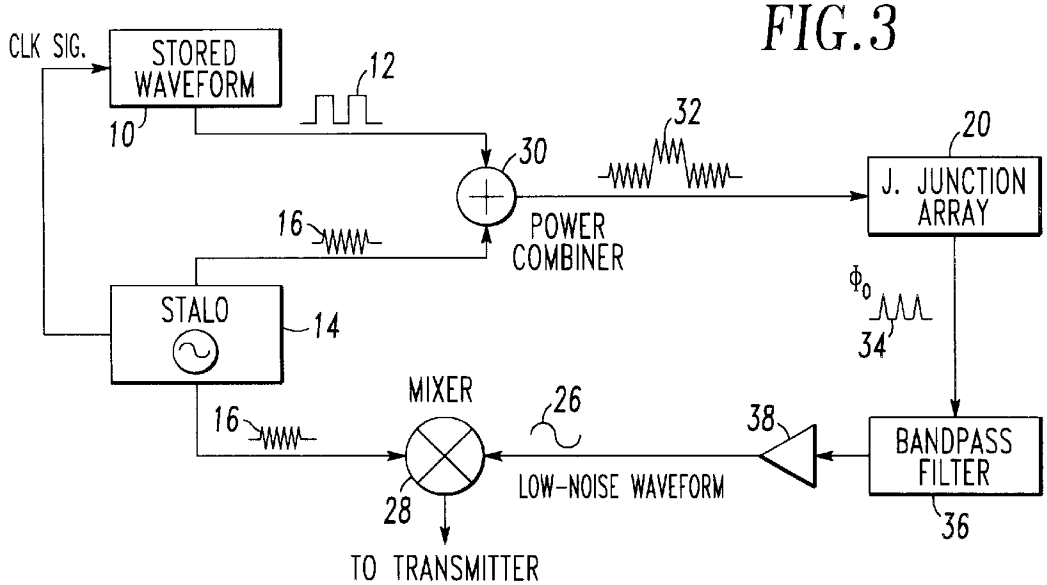
FIG.5
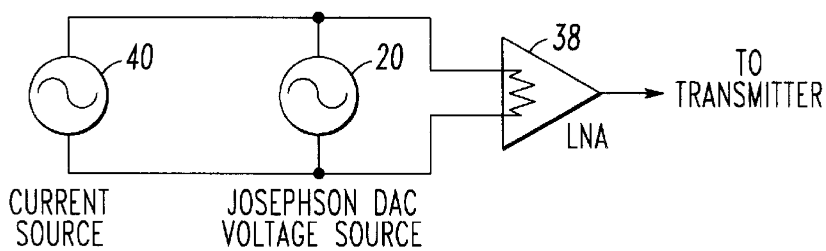
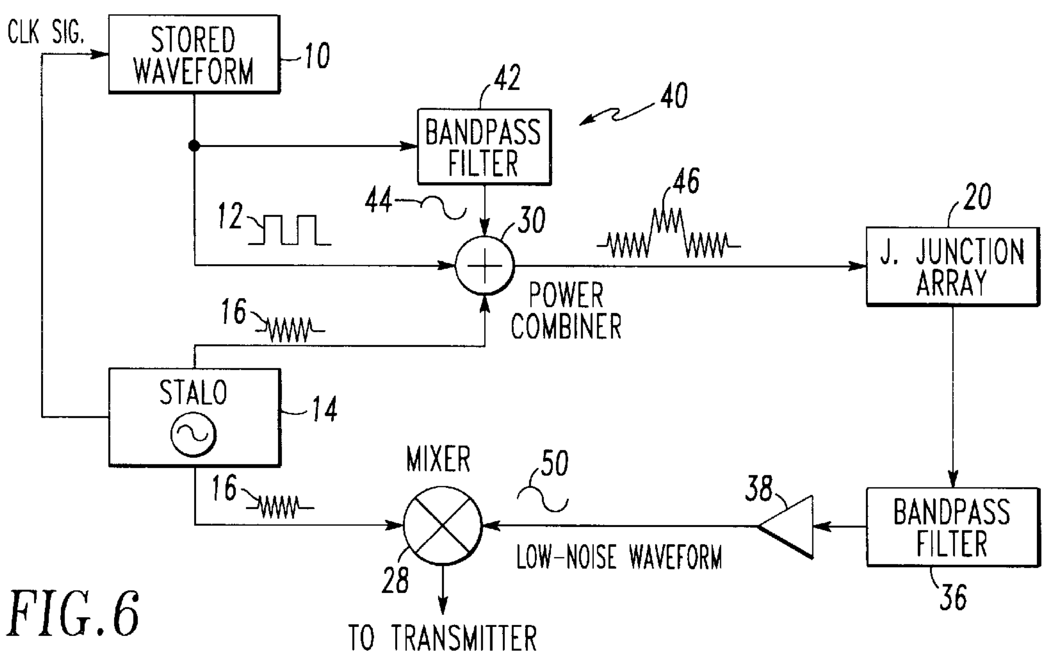
FIG.6

HIGH-POWER WAVEFORM GENERATOR

This patent application is related to U.S. Ser. No. 08/861,732 (Docket No. RDS 95-038) entitled "Cryogenic Radar System Including Josephson Junction Digital Analog Converter" filed in the names of J. X. Przybysz et al. on May 22, 1997, U.S. Pat. No. 5,760,736 entitled "Direct X-Band Waveform Generator" filed in the names of J. X. Przybysz et al. on Feb. 13, 1997; and U.S. Pat. No. 5,798,722 (Docket No. RDS-96-006) entitled "UHF Digital To Analog Converter For Cryogenic Radar System", filed in the names of J. X. Przybysz et al on Feb. 13, 1997. These applications are assigned to the Assignee of the present invention and are intended to be specifically incorporated herein by reference.

BACKGROUND OF THE INVENTION

1. Field of the Invention

This invention relates generally to low phase-noise waveform generators and more particularly to a relatively high power low phase-noise RF waveform generator utilizing Josephson junctions.

2. Description of Related Art

Josephson junctions are well known devices consisting of two superconductors separated by a thin film of dielectric material or normal metal. Such devices are typically comprised of superconductive layers of $YBa_2CU_3O_7$ separated by Co doped $YBa_2Cu_3O_7$ or Nb layers separated by $Al_2O_3$. Such devices produce quantum mechanically accurate voltage pulses generated as a result of phase shifts in the quantum wave function of the superconductive system. This is accomplished by making use of the well known Josephson effect which is characterized by absolutely repeatable constant voltage current steps in the junction's current-voltage characteristic. Josephson junctions comprise devices which can switch from one voltage state to another in times in the order of picoseconds. As is well known, a Josephson junction produces an output pulse of a single flux quantum $\Phi_0$ when an excitation pulse causes its critical current $I_C$ to be exceeded. This phenomenon was first discovered by B. D. Josephson in 1962.

Because the signal flux quantum is related to the elementary charge of the electrone and Plank's constant h, the Josephson effect manifests itself as a precise constant voltage step at $V=nhf/2e$ in its current-voltage (I/V) characteristic, where f is the frequency of excitation and n is an integer corresponding to the step number.

When a digital pulse train is applied across one or more Josephson junctions, causing their respective critical currents to be exceeded, a corresponding output of pulses is provided having a constant amplitude exhibiting a high degree of accuracy, on the order of 0.4 parts per million (ppm). This phenomenon can be used to generate low phase noise signals in the gigahertz (GHz) range thus being applicable to certain radar systems where it is necessary to detect targets which would otherwise be lost in noise or clutter. For a more detailed treatment of the Josephson junctions, the reader is referred to a publication entitled "The New Superconducting Electronics", ed. by Harold Weinstock and Richard W. Ralston, (ISBN O-7923-2512-X), Kluwer Academic Publishers, 1993.

In radar systems implemented with RF generators employing cryogenic techniques, low phase-noise RF signals can be obtained from cooled dielectric, e.g. sapphire, resonators. In the above cross reference related application Ser. No. 08/861,732, low phase-noise chirp signals are generated from which radar RF transmitter pulses are produced. In this system, digital waveforms of an analog chirp frequency spectrum are fed through a Josephson junction array which outputs the pulse train having quantum mechanically accurate uniform amplitudes. The data stream output across the Josephson junction is then fed to a low pass filter wherein low phase-noise analog chirp signals are extracted which when mixed with a low phase-noise RF carrier signal provide a low noise RF chirp signal for use in the radar transmitter.

SUMMARY

It is an object of the present invention, therefore, to generate low phase noise signals;

It is a further object of the invention to provide an RF waveform generator for generating low-phase-noise RF signals for a radar system;

It is another object of the invention to provide a relatively high power waveform generator for generating low-phase-noise RF signals having a digital analog signal converter including a Josephson junction array.

The foregoing and other objects are achieved by a method and apparatus for generating a low phase-noise RF signal where the output from a low noise local oscillator, operating at relatively high RF frequencies in the GHz range, is combined with a digital data stream which is representative of one or more analog signals in a predetermined frequency spectrum of relatively lower RF frequencies, in the MHz range, is applied to a Josephson junction array whose output, comprising a data stream including pulses of precise constant amplitude, is then fed to a bandpass filter circuit having a predetermined bandpass which then extracts the lower frequency analog signal but now having low phase-noise. These low phase-noise signals are mixed with the low phase-noise output from the local oscillator, thus providing a low phase-noise RF signal which can be coupled to a radar transmitter for example, in the generation of transmitter radar pulses for achieving enhanced detection of targets in clutter which would otherwise not be detected.

The power capability of the Josephson junction array is also increased by adding a source of current to the input to the Josephson junction array and which is derived from the digital data stream by means of an additional bandpass filter so as to match the Josephson voltage in phase, amplitude and frequency.

Further scope of applicability of the present invention will become apparent from the detailed description provided hereinafter. It should be understood, however, that the detailed description and specific examples, while indicating preferred embodiments of the invention, are provided by way illustration only since various changes, alterations and modifications coming within the spirit and scope of the invention will become apparent to those skilled in the art from the detailed description.

BRIEF DESCRIPTION OF THE DRAWINGS

The present invention will become more fully understood when considered together with the accompanying drawings which are provided only for purposes of illustration and thus are not limitative of the invention, and wherein:

FIG. 1, is an electrical block diagram illustrative of the related art;

FIG. 2, is a set of waveforms illustrative of the operation of the system shown in FIG. 1;

FIG. 3, is an electrical block diagram illustrative of a first embodiment of the invention;

FIG. 5, is an electrical block diagram illustrative of a second embodiment of the invention;

FIG. 6, is an electrical block diagram further illustrative of the second embodiment partially shown in FIG. 5.

DETAILED DESCRIPTION OF THE PREFERRED EMBODIMENTS

Figure 4:
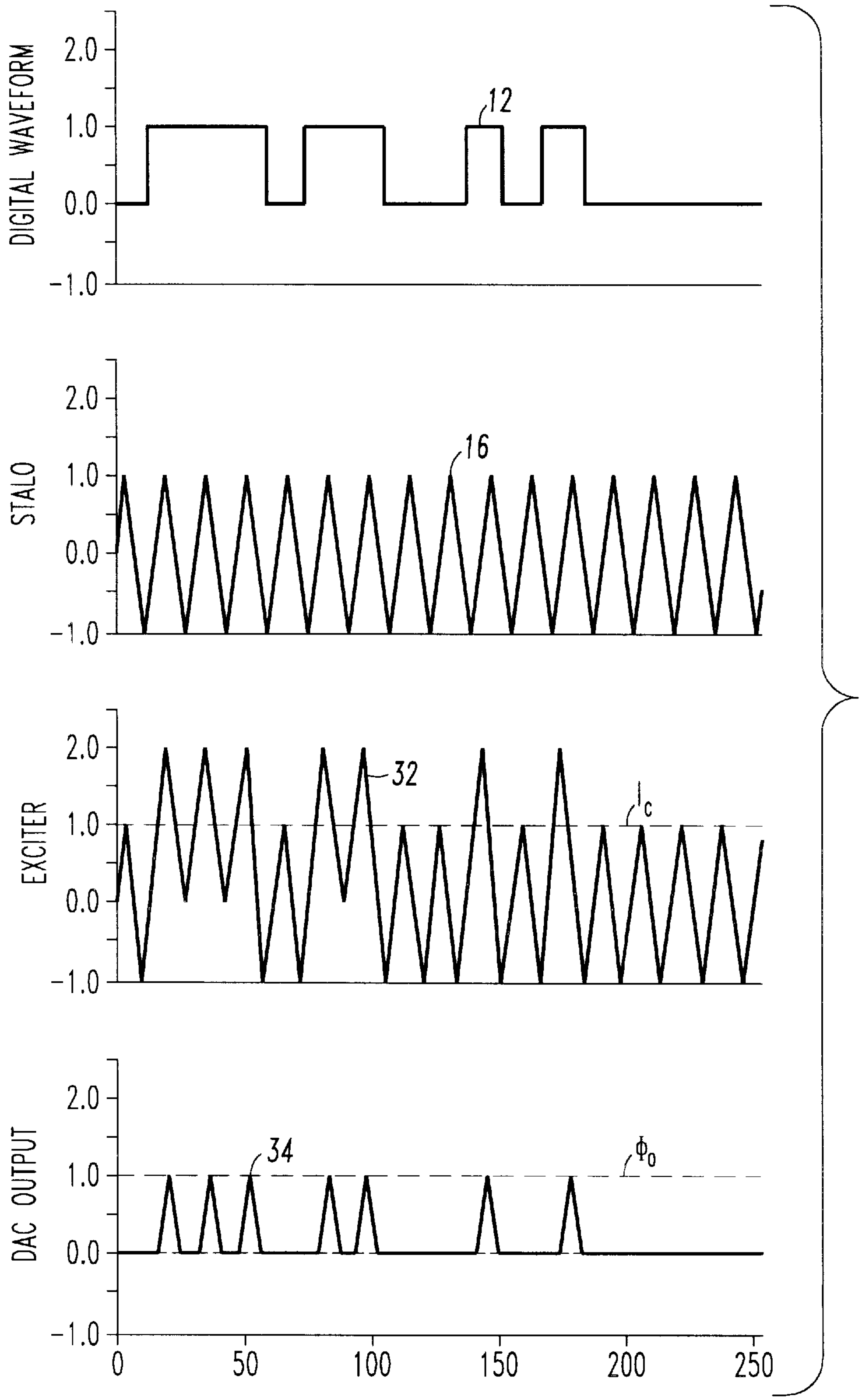
FIG. 4, is a set of waveforms illustrative to the operation of the embodiment shown in FIG. 3.

Referring now to the drawings wherein like reference numerals refer to like elements throughout, FIGS. 1 and 2 illustrate the inventive concept set forth in the above cross-referenced related application U.S. Ser. No. 08/861,732.

As shown in FIG. 1, reference 10 denotes a stored waveform generator consisting of a digital memory for example, a random access memory (RAM) wherein there is stored one or more signal frequencies e.g. a chirp frequency spectrum and which is included in the digital data stream 12 outputting therefrom as shown in FIG. 2. The stored waveform generator 10 is clocked by the signal generated by a low phase-noise stabilized local oscillator (STALO) 14. The STALO 14 comprises a cryogenically cooled dielectric (sapphire) resonator which outputs a low phase-noise RF signal 16 having a fixed frequency of 10 GHz. The stored waveform generator 10 generates and outputs a digital data stream representative of analog signals in the frequency range of 10 MHz.

Further as shown in FIG. 1, the digital data stream 12 is fed to a high speed digital logic gate 18 which is used to drive a Josephson junction array 20 with the digital data stream 12. The amplitude of the binary ONE values of the digital data stream excite the Josephson junctions in the array 20 so as to generate and output a corresponding digital data stream 22 (FIG. 2) wherein each and every binary digital ONE pulse has an identical quantum mechanically precise amplitude.

The output data stream 22 of the Josephson junction array 20 is then fed to a low pass filter 24 which operates to retrieve in analog form the waveform(s) outputted from the waveform generator 10. Accordingly, a low phase-noise analog waveform signal shown by reference 26 in FIG. 2 is outputted from the filter 24 when it is then fed to a mixer 28 along with the fixed frequency (10 GHz) output signal 16 of the STALO 14. The digital data stream 12 represents both linear and non-linear FM chirp signals. Thus, the output of the mixer 28 comprises a chirp RF signal in the range, for example, 10.00–10.002 Ghz and having relatively low phase-noise which can then be used to generate radar transmit pulses.

While such configuration operates as intended, it is nevertheless responsive to any timing jitter on the leading edge of the digital logic data stream 12 generated by the stored waveform generation 10 and hence will produce phase noise in the waveform 26. This now leads to the subject invention the purpose of which is to eliminate sensitivity to timing jitter in the digital data stream 12.

Referring now to FIGS. 3 and 4, which is directed to the first embodiment of the subject invention, the digital data stream 12 which comprises a chirp signal of either linear or non-linear FM frequencies and the STALO signal 16 are now combined in a signal adder 30 so as to produce a composite signal such as shown by reference 32 and which is now fed to the Josephson junction array 20. Heretofore, as shown in FIGS. 1 and 2, the digital data stream 12 itself was used solely to excite the Josephson junction array 20. In this invention, however, the binary ONE amplitude of the digital data stream 12 is used to bias the array 20 to the critical current threshold level IC as shown in FIG. 4. That portion of the STALO signal, generated by a cooled dielectric resonator such as the oscillator 14 described with respect to FIG. 1, 16 rising above the $I_c$ level now excites the Josephson junction array 20 to output a pulse stream such as shown by reference 34 where each and every pulse has an identical quantum mechanically precise amplitude $\Phi_0$.

Further as shown in FIG. 3, the output pulse stream 34 appearing across the Josephson junction array 20 is now fed to a bandpass filter 36 having a bandpass of, for example, 400–600 MHz which retrieves the low noise analog waveform 26 (FIG. 2). This signal is then fed to the mixer 28 through a low noise amplifier 38. Such an arrangement enables the low noise waveform 26 to have a phase noise as low as the STALO signal 16 which when mixed in the signal mixer 28 provides a chirped RF output which is not constrained by the timing jitter which might appear on the digital pulse train 12 from the stored waveform generator 10. This is achieved because the STALO portion of the signal 32 excites the Josephson junction array 20 rather than the pulses of the digital waveform 12.

Figure 7:
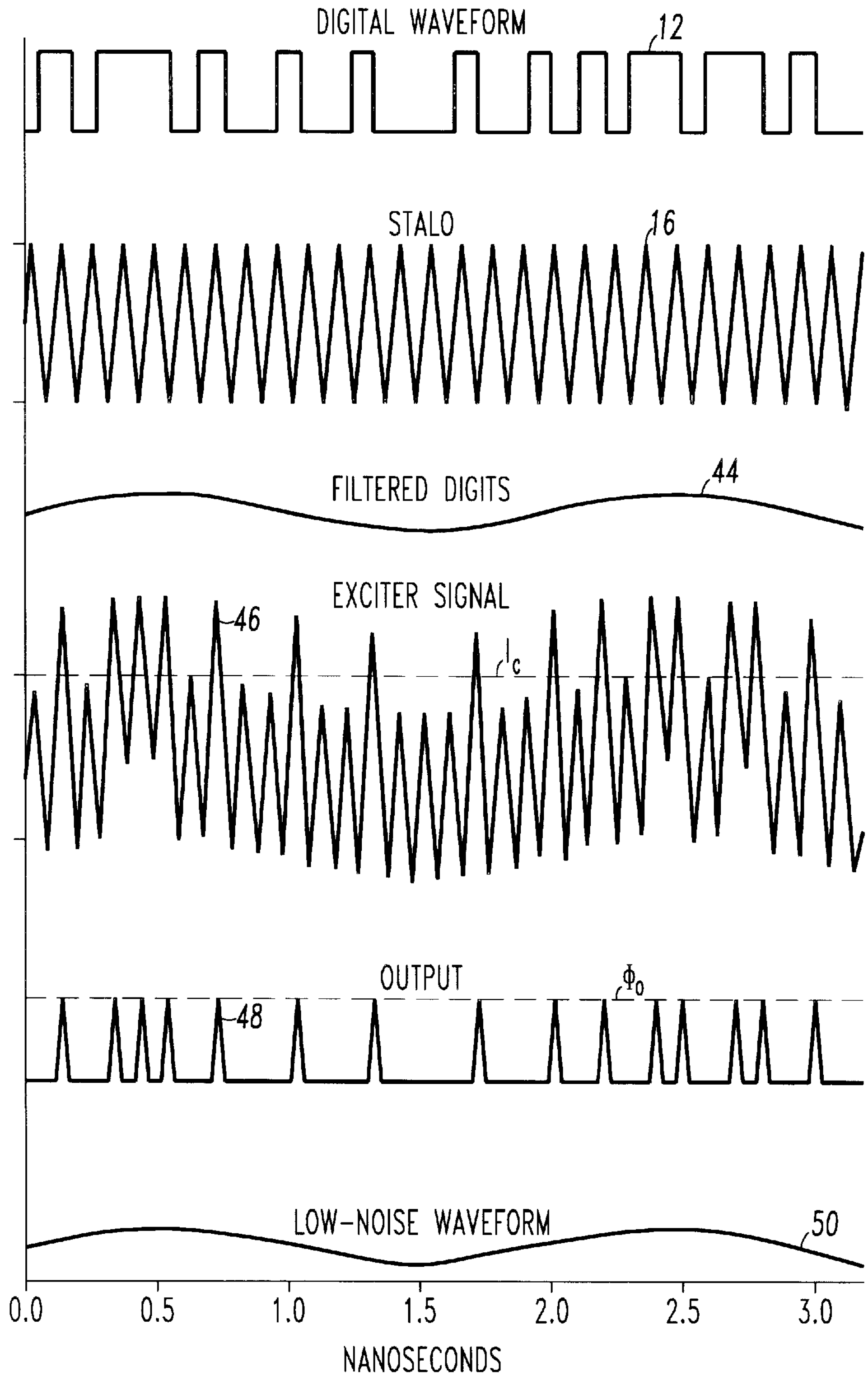
FIG. 7, is a set of waveforms illustrative of the operation of the second embodiment of the invention shown in FIG. 6.

Referring now to FIGS. 5, 6, and 7, shown thereat is a second embodiment of the subject invention whereby the power capability of the Josephson junction array is increased by, for example, 40 dB. As shown in FIG. 5 a current source shown by reference 40 is coupled across the Josephson junction array whose output is fed to a low noise amplifier 38. The embodiment shown in FIG. 6 discloses a means whereby the current source 40 is implemented. The implementation comprises a second bandpass filter 42 having a bandpass of, for example, 400–600 MHz coupled to the digital data stream 12 of chirp frequencies outputted from the stored waveform generator 10. The filter 42 recovers an AC signal 44 shown in FIG. 7 which corresponds to the analog frequency signal represented by the digital data stream 12. The analog signal 44 is now also coupled to the power combiner 30 as an added bias where a composite waveform such as shown by reference 46 in FIG. 7 is generated and which is thereafter fed to the Josephson junction array 20. This results in a pulse output as shown by reference 48 shown in FIG. 7 which when coupled to the bandpass filter 36 produces a low noise waveform 50 which is coupled to mixer 28 as before. The bandpass filter 42 derives the current source signal 44 in a simple elegant fashion and it matches the Josephson voltage in phase, amplitude and frequency. Furthermore, it requires only passive components.

The embodiment shown in FIG. 6 enables a production of high power digital waveforms that are linear and non-linear FM signals for generating a chirp RF output from the mixer 28 which can then be used in the generation of chirp radar pulses transmitted to a target and which is thereby able to improve detection of targets in clutter which would otherwise not be capable of being detected.

One additional feature of the embodiment shown in FIG. 6 is that the Josephson junction array can perform its desired function with fewer junctions than heretofore necessary and thus reduces the risk caused by non-uniformity of junctions.

Thus, having shown and described what is presently considered the preferred embodiments of the invention, it should be noted that the same had been-made by way of illustration and not limitation. Accordingly, all modifications, alterations and changes coming within the spirit and scope of the invention as set forth in the appended claims are herein meant to be included.

What is claimed:

1. Apparatus for generating a low phase-noise RF signal for use in a radar system, comprising:

a digital signal generator generating a digital data stream having binary amplitude values representative of an analog signal of at least a first RF frequency;

an analog signal generator generating a relatively low phase-noise analog signal of a second RF frequency;

a power combiner connected to said digital signal generator and said analog signal generator, being responsive to said digital data stream and said low phase-noise analog signal and outputting a composite signal comprised of said digital data stream and said low phase-noise analog signal of a second RF frequency;

an array of series connected Josephson junctions coupled to said power combiner and being biased and excited by said composite signal outputted from said power combiner to generate a digital data stream having quantum mechanically accurate binary amplitude values;

a filter circuit coupled across said array and being responsive to said digital data stream having quantum mechanically accurate binary amplitude values for generating a relatively low phase-noise analog signal of said analog signal of said at least a first RF frequency; and a signal mixer coupled to said analog signal generator and said filter circuit, said mixer being responsive to both said low phase-noise analog signals generated thereby and then generating therefrom a low phase-noise RF output signal for use with radar transmitter apparatus in said radar system.

2. Apparatus in accordance with claim 1 wherein said analog signal of said at least a first RF frequency includes a spectrum of RF frequencies within a predetermined frequency band.

3. Apparatus in accordance with claim 2 wherein said spectrum of RF frequencies are swept across said predetermined frequency band.

4. Apparatus in accordance with claim 2 wherein said spectrum of RF frequencies are swept linearly across said predetermined frequency band.

5. Apparatus in accordance with claim 2 wherein said spectrum of RF frequencies are swept non-linearly across said predetermined frequency band.

6. Apparatus in accordance with claim 2 wherein said spectrum of RF frequencies comprises a chirp spectrum.

7. Apparatus in accordance with claim 2 wherein said filter circuit comprises a bandpass filter.

8. Apparatus in accordance with claim 2 wherein one portion of said composite signal applies a bias current to the array of Josephson junctions and another portion of said composite signal excites the array.

9. Apparatus in accordance with claim 8 wherein said one portion of said composite signal comprises a digital data stream portion and said another portion comprises a low phase-noise analog signal portion of said composite signal.

10. Apparatus in accordance with claim 2 wherein said digital signal generator comprises a stored waveform generator.

11. Apparatus in accordance with claim 10 wherein said stored waveform generator comprises a random access memory.

12. Apparatus in accordance with claim 11 wherein said random access memory is programmed with a predetermined chirp frequency spectrum.

13. Apparatus in accordance with claim 1 wherein said analog signal generator of said second RF frequency comprises a local oscillator including a cryogenically cooled dielectric resonator generating a fixed frequency signal.

14. Apparatus in accordance with claim 1 and further comprising a current source additionally coupled to said array of Josephson junctions for increasing the power in the digital data stream having quantum mechanically accurate binary amplitude values.

15. Apparatus in accordance with claim 14 wherein said current source is connected to said power combiner.

16. Apparatus in accordance with claim 15 wherein said current source comprises a filter circuit having an input connected to said digital signal generator and providing an output of said analog signal of said first RF frequency.

17. Apparatus in accordance with claim 16 wherein said filter circuit comprises a bandpass filter.

18. Apparatus for generating a low phase-noise RF signal for use in a radar system, comprising:

a digital signal generator generating a digital data stream having binary amplitude values representative of an analog signal of at least a first RF frequency;

a first filter circuit connected to the digital signal generator for providing an output of said analog signal of said first RF frequency;

an analog signal generator generating a relatively low phase-noise analog signal of a second RF frequency; and a power combiner connected to said first filter circuit and said analog signal generator and outputting a composite signal of said analog signal of said first RF frequency and said low phase-noise analog signal of said second RF frequency;

an array of series connected Josephson junctions coupled to said signal adder and being biased and excited by said composite signal to generate a digital data stream having quantum mechanically accurate binary amplitude values, a second filter circuit coupled across the Josephson junction array and being responsive to said digital data stream having quantum mechanically accurate binary amplitude values for generating a relatively low phase-noise analog signal of said analog signal of said at least said first RF frequency; and a signal mixer coupled to said analog signal generator and said second filter circuit, said mixer being responsive to both said low phase-noise analog signals generated thereby and then generating therefrom a low phase-noise RF output signal for use with radar transmitter apparatus in said radar system.

19. Apparatus in accordance with claim 18 wherein said first and second filter circuits comprise bandpass filters.

20. Apparatus in accordance with claim 18 wherein said analog signal generator comprises a cryogenically cooled dielectric resonator generating a fixed frequency signal.

21. A method of generating a low phase-noise RF signal for use in a radar system comprising the steps of:

generating a digital data stream having binary amplitude values representative of an analog signal of at least one frequency;

generating a relatively low phase-noise analog signal of a second frequency;

combining said digital data stream and said low phase-noise analog signal into a composite signal;

feeding said composite signal to an array of series connected Josephson junctions and outputting therefrom a digital data stream having quantum mechanically accurate binary amplitude values;

filtering said digital data stream having quantum mechanically accurate binary amplitude values to generate a relatively low phase-noise analog signal corresponding to said at least one frequency; and mixing said analog signals to generate an output signal comprising a low phase noise RF signal for use in the generation of an RF transmit pulse by said radar system.

22. The method as defined by claim 21 wherein said step of generating a digital data stream of an analog signal of at least one frequency comprises generating a digital data stream representative of a spectrum of frequencies within a predetermined frequency band.

23. The method as defined by claim 22 wherein said step of generating a digital data stream includes the step of sweeping said frequencies across said frequency band so as to generate a chirp signal.

24. The method as defined by claim 22 and further comprising the additional steps of generating a current drive signal for increasing the power in said digital data stream outputted from said array of Josephson junctions and adding said current drive signal to said composite signal.

25. The method as defined by claim 24 wherein said step of generating said current drive signal comprises filtering the digital data of said spectrum of frequencies.

* * * * *